(12) United States Patent
Camp et al.

(10) Patent No.: US 9,653,185 B2
(45) Date of Patent: May 16, 2017

(54) REDUCING ERROR CORRECTION LATENCY IN A DATA STORAGE SYSTEM HAVING LOSSY STORAGE MEDIA

(71) Applicant: INTERNATIONAL BUSINESS MACHINES CORPORATION, Armonk, NY (US)

(72) Inventors: Charles J. Camp, Sugar Land, TX (US); Evangelos S. Eleftheriou, Rueschlikon (CH); Charalampos Pozidis, Thalwil (CH); Gary A. Tressler, Sandy Hook, CT (US); Andrew D. Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 14/514,073

(22) Filed: Oct. 14, 2014

(65) Prior Publication Data

US 2016/0103733 A1 Apr. 14, 2016

(51) Int. Cl.
| | | |
|---|---|---|
| *G06F 11/10* | (2006.01) | |
| *G11C 29/52* | (2006.01) | |
| *G11C 16/34* | (2006.01) | |
| *G11C 29/04* | (2006.01) | |

(52) U.S. Cl.
CPC .......... *G11C 29/52* (2013.01); *G06F 11/1048* (2013.01); *G06F 11/1068* (2013.01); *G11C 16/3418* (2013.01); *G11C 2029/0411* (2013.01)

(58) Field of Classification Search
CPC ... G06F 11/1068; G06F 11/1048; G11C 29/52
See application file for complete search history.

(56) References Cited

U.S. PATENT DOCUMENTS

| | | | | |
|---|---|---|---|---|
| 6,138,263 A * | 10/2000 | Kodama | ............ | G11B 20/1813 714/769 |
| 6,243,845 B1 * | 6/2001 | Tsukamizu | ....... | G11B 20/10527 714/752 |
| 6,412,091 B2 * | 6/2002 | Hill | ..................... | G11B 20/1816 714/718 |
| 7,020,825 B2 * | 3/2006 | Watanabe | .......... | G11B 20/1833 714/763 |
| 7,971,124 B2 | 6/2011 | Spanel et al. | | |

(Continued)

*Primary Examiner* — Albert Decady
*Assistant Examiner* — Paul Contino
(74) *Attorney, Agent, or Firm* — Brian F. Russell; Randall J. Bluestone

(57) ABSTRACT

In at least one embodiment, a read operation in a data storage system having lossy storage media includes fetching target data of the read operation from a lossy storage device into a buffer, transferring the target data from the buffer to an external controller external to the lossy storage device via a communication bus, performing error location processing on the target data during the transferring of the target data, communicating error location information regarding at least one error location to error repair logic via the communication bus, the error repair logic repairing the at least one error in the target data using the error location information, and the external controller causing the target data as repaired to be transmitted toward a destination. By deserializing the suboperations comprising the read operation, read latency can be reduced.

23 Claims, 7 Drawing Sheets

(56) References Cited

U.S. PATENT DOCUMENTS

| | | | | |
|---|---|---|---|---|
| 8,301,986 B2 * | 10/2012 | Jo | ............... | G06F 11/1068 |
| | | | | 714/785 |
| 8,418,028 B2 | 4/2013 | Yamaga | | |
| 8,627,174 B2 | 1/2014 | Kim et al. | | |
| 9,213,602 B1 * | 12/2015 | Alhussien | ............ | G06F 11/1068 |
| 2002/0099995 A1 * | 7/2002 | Furukawa | ............ | G06F 11/1068 |
| | | | | 714/766 |
| 2003/0041299 A1 * | 2/2003 | Kanazawa | ........... | G06F 11/1072 |
| | | | | 714/766 |
| 2004/0187052 A1 * | 9/2004 | Shiota | ............ | G06F 11/1044 |
| | | | | 714/718 |
| 2008/0270824 A1 * | 10/2008 | Kroesche | ............ | G06F 11/1048 |
| | | | | 714/6.11 |
| 2009/0024899 A1 * | 1/2009 | Reid | ............ | H03M 13/09 |
| | | | | 714/758 |
| 2010/0011247 A1 * | 1/2010 | Shrader | ............ | G06F 11/1048 |
| | | | | 714/25 |
| 2011/0035539 A1 * | 2/2011 | Honda | ............ | G06F 11/1068 |
| | | | | 711/103 |
| 2012/0159286 A1 * | 6/2012 | Koshiyama | ......... | G06F 11/1048 |
| | | | | 714/768 |
| 2012/0239996 A1 * | 9/2012 | Higeta | ............ | G06F 11/1048 |
| | | | | 714/746 |
| 2014/0029338 A1 | 1/2014 | Shalvi et al. | | |
| 2015/0149857 A1 * | 5/2015 | Motwani | ............ | H03M 13/05 |
| | | | | 714/763 |

\* cited by examiner

REDUCING ERROR CORRECTION LATENCY IN A DATA STORAGE SYSTEM HAVING LOSSY STORAGE MEDIA

BACKGROUND OF THE INVENTION

This disclosure relates to data processing and storage, and more specifically, to reducing error correction latency in a data storage system having lossy storage media, such as flash memory.

Flash memory is a non-volatile memory technology that stores one or more bits of data per memory cell as a charge on the floating gate of a transistor. FIG. 1 illustrates a conventional flash memory system 100, which includes one or more flash modules 102 each including multiple flash die 104 (only one of which is illustrated). Each flash die 104 in turn includes a flash array 106, which includes a plurality of memory cells for storing one or more bits of data, and an input/output (I/O) buffer 108, which temporarily buffers data read from and written into flash array 106. The operation of the flash module(s) 102 and read and write accesses to flash array 106 are controlled by an external flash controller 110 typically coupled to flash module 102 by a communication bus. Flash controller 110 includes an error correcting code (ECC) circuit 112 that detects and corrects errors in the data read from flash array 106 by reference to error correcting codes (ECC) stored in flash array 106 in conjunction with the data.

As shown in FIG. 1, in a conventional flash memory, a read operation is comprised of a number of distinct suboperations, including 1) a fetch suboperation that fetches a granule of data and associated ECC stored within flash array 106 into an I/O buffer 108 within the same flash die 104 as the flash array 106, 2) a transfer suboperation that transfers the data granule and associated ECC from I/O buffer 108 to ECC circuit 112 of the external flash controller 110 via the external communication bus connecting flash module 102 and flash controller 110, 3) an error detection and correction suboperation in which ECC circuit 112 detects any bit error(s) in the data granule and, if possible, corrects the bit error(s), if any, and 4) a forward (or unload) operation in which flash controller 110 forwards the data granule, as corrected, to a destination. These four suboperations are generally serialized and do not overlap in time.

Referring now to FIG. 2, there is depicted a block diagram of an alternative flash memory system 200 in accordance with the prior art. Flash memory system 200 includes one or more flash modules 202 each including multiple flash die 204 (only one of which is illustrated). Each flash die 204 in turn includes a flash array 206, which includes a plurality of memory cells for storing one or more bits of data, and an input/output (I/O) buffer 208, which temporarily buffers data read from and written into flash array 206. In contrast to flash memory system 100 of FIG. 1, control is implemented in flash memory system 200 of FIG. 2 by a small internal controller 210 integrated within each flash module 202 rather than by an external flash controller 110. The integration of NAND flash die and error correction circuitry in a single package in this manner is sometimes referred to as "managed NAND." Internal controller 210 includes an ECC circuit 212 that detects and corrects errors in the data read from flash array 206 by reference to error correcting codes (ECC) stored in flash array 206 conjunction with the data.

In flash memory system 200, the suboperations of a read operation, while essentially the same as those performed in flash memory system 100 of FIG. 1, are performed slightly differently given the architectural differences. In particular, the transfer suboperation transfers data and the associated ECC from I/O buffer 208 in flash die 204 to the internal controller 210 disposed within the same device package as the flash die 204. In addition, the error detection and correction suboperation is performed by an ECC circuit 212 co-located within the flash module 202 (rather than in an external flash controller 110), and the final forward suboperation forwards the corrected data granule across the external I/O bus of flash module 202 rather than the I/O bus of external flash controller 110, which typically has a much greater bandwidth.

With reference now to FIG. 3, a timing diagram is given that illustrates the relative read latencies for conventional flash memory systems 100 and 200. The read operation of flash memory system 100 includes fetch suboperation 300, transfer suboperation 302, detect and correct suboperation 304 and forward suboperation 306, and the read operation of flash memory system 200 includes corresponding suboperations 310, 312, 314 and 316, respectively. Due to the serialization of the suboperations, the total latency of each of the read operations can be computed simply by aggregating the latencies of the suboperations.

As indicated, a flash memory system 200 having managed NAND flash can generally complete the fetch and transfer suboperations 310 and 312 more quickly than the corresponding suboperations 300, 302 of flash memory system 100 given the proximity of internal controller 210 to flash die 204. However, the overall read latency of a flash memory system 100 having an dedicated external flash controller 110 is generally lower because flash controller 110 has a forwarding bandwidth many times greater than the I/O bandwidth of a single flash module 202. In addition, an external flash controller 110 often includes an ECC circuit 112 that is far more powerful and significantly faster than the analogous ECC circuit 212, which must be sized small enough to be integrated into a flash memory device package with the flash die 204.

BRIEF SUMMARY

Heretofore, there has not been a compelling reason to evaluate the limitations of the serialization of the suboperations comprising a read operation in data storage systems having lossy storage media, such as flash memory. However, as flash array cell densities and the number of bits stored per flash memory cell continue to increase in subsequent generations of flash technology, the data stored in the memory cells to become more vulnerable to bit errors induced by read disturbs, high ambient temperatures, long storage durations and other factors. Consequently, as the number of bit errors has increased, the contribution of error detection and correction to the latency of read operations has increasing become an important factor in read performance for data storage systems having lossy storage media.

In at least one embodiment, a read operation in a data storage system having lossy storage media includes fetching target data of the read operation from a lossy storage device into a buffer, transferring the target data from the buffer to an external controller external to the lossy storage device via a communication bus, performing error location processing on the target data during the transferring of the target data, communicating error location information regarding at least one error location to error repair logic via the communication bus, the error repair logic repairing the at least one error in the target data using the error location information, and the external controller causing the target data as repaired to be transmitted toward a destination. By deserializing the suboperations comprising the read operation, read latency can be reduced.

DETAILED DESCRIPTION

Figure 4:
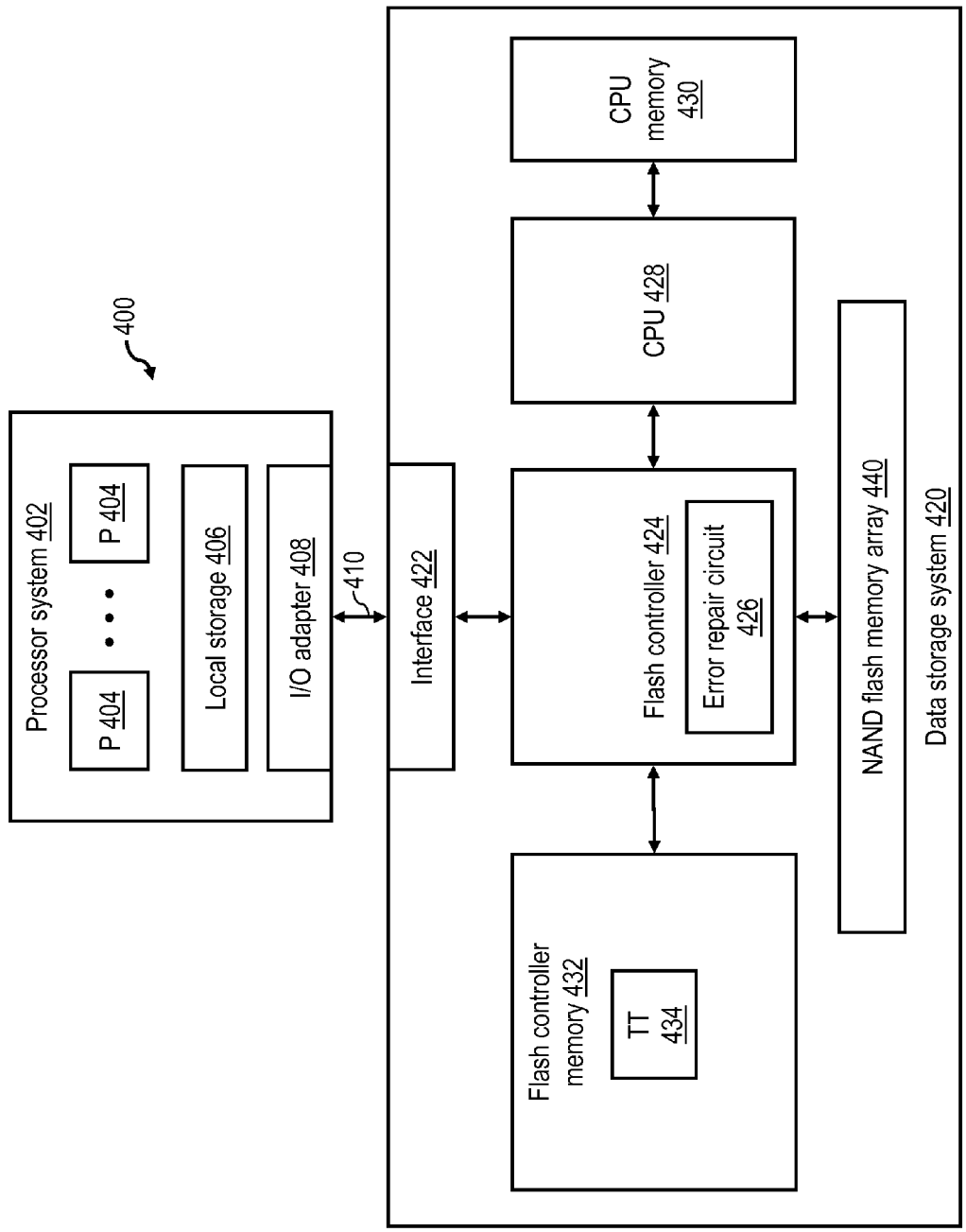
FIG. 4 is a high level block diagram of a data processing environment including a data storage system in accordance with one embodiment.

With reference again to the figures and with particular reference to FIG. 4, there is illustrated a high level block diagram of an exemplary data processing environment 400 including a data storage system having lossy storage media as described further herein. As shown, data processing environment 400 includes at least one processor system 402 having one or more processors 404 that process instructions and data. Processor system 402 may additionally include local storage 406 (e.g., dynamic random access memory (DRAM) or disks) that may store program code, operands and/or execution results of the processing performed by processor(s) 404. In various embodiments, processor system 402 can be, for example, a mobile computing device (such as a smartphone or tablet), a laptop or desktop personal computer system, a server computer system (such as one of the POWER series available from International Business Machines Corporation), or a mainframe computer system. Processor system 402 can also be an embedded processor system using various processors such as ARM, PowerPC, Intel X86, or any other processor combined with memory caches, memory controllers, local storage, I/O bus hubs, etc.

Processor system 402 further includes an input/output (I/O) adapter 408 that is coupled directly (i.e., without any intervening device) or indirectly (i.e., through at least one intermediate device) to a data storage system 420 via an I/O channel 410. In various embodiments, I/O channel 410 may employ any one or a combination of known or future developed communication protocols, including, for example, Fibre Channel (FC), FC over Ethernet (FCoE), Internet Small Computer System Interface (iSCSI), Transport Control Protocol/Internet Protocol (TCP/IP), Peripheral Component Interconnect Express (PCIe), etc. I/O operations (IOPs) communicated via I/O channel 410 include read IOPs by which processor system 402 requests data from data storage system 420 and write IOPs by which processor system 402 requests storage of data in data storage system 420.

In the illustrated embodiment, data storage system 420 includes an interface 422 through which data storage system 420 receives and responds to IOPs via I/O channel 410. Interface 422 is coupled to a storage controller, such as flash controller 424 (e.g., an Application Specific Integrated Circuit (ASIC) or Field Programmable Gate Array (FPGA)) having an associated flash controller memory 432 (e.g., Dynamic Random Access Memory (DRAM)). Flash controller 424 is additionally coupled to a CPU 428 having an associated CPU memory 430 (e.g., DRAM) and further coupled to lossy storage media, such as the NAND flash memory within NAND flash memory array 440. In embodiments in which flash controller 424 is implemented with an FPGA, CPU 428 may program and configure flash controller 424 during start-up of data storage system 420. After startup, in general operation flash controller 424 receives read and write IOPs via I/O channel 410 and interface 422 to read data stored in NAND flash memory array 440 and/or to store data in NAND flash memory array 440. Flash controller 424 services these IOPs, for example, by accessing NAND flash memory array 440 to read or write the requested data from or into NAND flash memory array 440 or by accessing a memory cache (not illustrated) associated with NAND flash memory array 440. In the illustrated embodiment, flash controller 424 includes an error repair circuit 426 that, if possible, repairs error in data read from NAND flash memory array 440, as discussed further below.

In a typical implementation, flash controller 424 implements a flash translation layer (FTL) that provides logical-to-physical address translation to enable access to specific memory locations within NAND flash memory array 440. In general, an IOP received by flash controller 424 from a host device, such as a processor system 402, contains the logical block address (LBA) at which the data is to be accessed (read or written) and, if a write IOP, the write data to be stored to data storage system 420. The IOP may also specify the amount (or size) of the data to be accessed. Other information may also be communicated depending on the protocol and features supported by data storage system 420. As is known to those skilled in the art, NAND flash memory, such as that employed in NAND flash memory array 440, is constrained by its construction such that the smallest granule of data that can be fetched by a read IOP or written by a write IOP is fixed at the size of a single flash memory page, for example, 16 kilobytes (kB). The LBA provided by the host device thus corresponds to a page within a logical address space. The flash translation layer translates this LBA into a physical address assigned to a corresponding physical location in NAND flash memory array 440. Flash controller 424 may perform address translation and/or store mappings between logical and physical addresses by reference to a logical-to-physical translation data structure, such as translation table (TT) 434, which may conveniently be stored in flash controller memory 432. In various embodiments, flash controller 124 may maintain one or more additional data structures to track information regarding NAND flash memory array 440, which data structures may also be buffered in flash controller memory 432.

Figure 5:
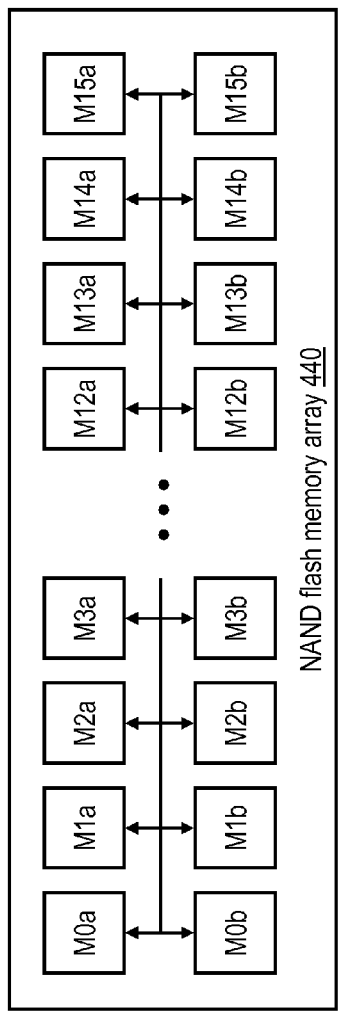
FIGS. 5 illustrates an exemplary embodiment of the NAND flash memory array of FIG. 4.

NAND flash memory array 140 may take many forms in various embodiments. With reference now to FIG. 5, there is illustrated one exemplary arrangement of physical memory within a NAND flash memory array 440 in accordance with the present disclosure. As shown in FIG. 5, NAND flash memory array 440 may be formed from thirty-two (32) individually addressable NAND flash memory storage devices. In the illustrated example, each of the flash memory storage devices M0a-M15b takes the form of a board-mounted flash memory module, for example, a Single Level Cell (SLC), Multi-Level Cell (MLC), Three Level Cell (TLC), or Quad Level Cell (QLC) NAND flash memory module. The thirty-two NAND flash memory modules are arranged in sixteen groups of two (M0a, M0b) through (M15a, M15b). For purposes of the physical addressing scheme, each group of two modules forms a "lane," also sometimes referred to as a "channel," such that NAND flash memory array 440 includes sixteen channels or lanes (Lane0-Lane15).

In a preferred embodiment, each of the individual lanes has a respective associated communication bus coupling it to flash controller 424. Thus, by directing its communications to one of the specific communication buses, flash controller 424 can direct its communications to one of the lanes of memory modules. Because each communication bus for a given lane is independent of the communication buses for the other lanes, flash controller 424 can issue commands and send or receive data across the various communication buses at the same time, enabling flash controller 424 to access the memory modules corresponding to the individual lanes at, or very nearly at, the same time.

Figure 6:
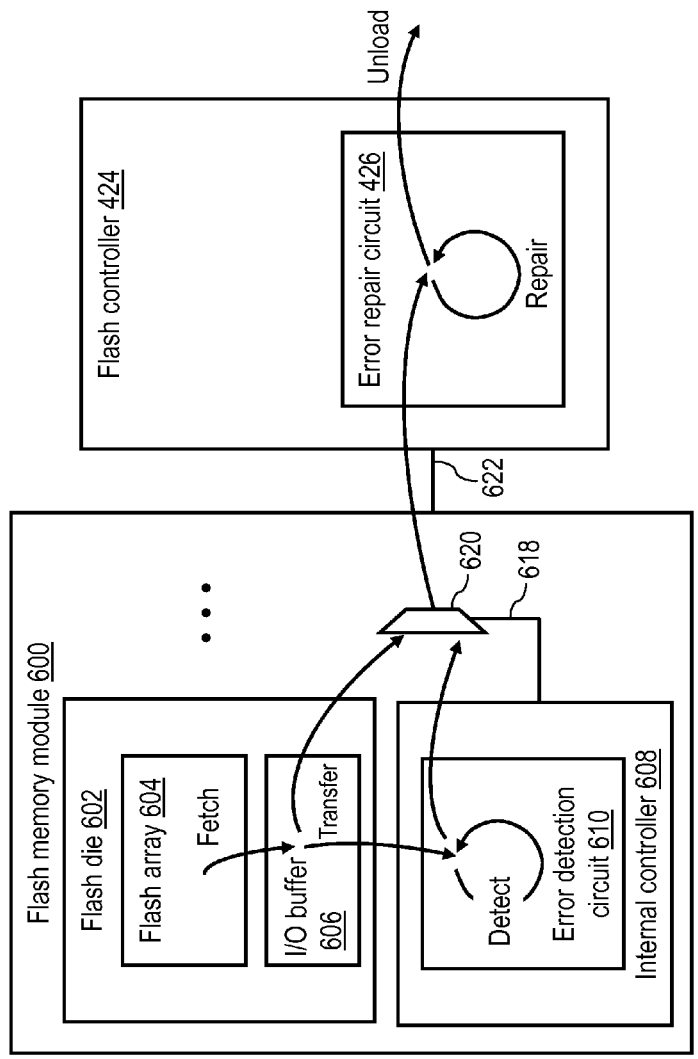
FIG. 6 depicts an exemplary embodiment of the flash memory module of FIG. 5.

Referring now to FIG. 6, there is illustrated an exemplary embodiment of a flash memory module 600 that can be utilized to implement any of flash memory modules M0a-M15b of FIG. 5. As shown in FIG. 6, the physical storage locations provided by flash memory module 600 are further distributed among multiple independently addressable flash die 602, only one of which is specifically shown. Each flash die 602 includes a flash array 604 formed of NAND flash storage cells, as well as an I/O buffer 606 that temporarily buffers data read from or to be written into flash array 604. I/O buffer 606 communicates data read from flash array 604 to external flash controller 424 via the communication bus 622 of the associated memory lane.

As further illustrated in FIG. 6, flash memory module 600 additionally contains an internal controller 608 that provides an additional layer of control for the multiple flash die 602 packaged within flash memory module 600. As shown, in at least one embodiment, internal controller 608 includes at least an error detection circuit 610 that detects the location(s) of errors, if any, in data read from the flash die 602 of flash memory module 600 and reports the error location information to external flash controller 424 via communication bus 622. For example, in at least one embodiment, error detection circuit 610 detects error locations by calculating a syndrome for the data read from flash die 602 and then calculating the error location(s) based on the syndrome. In alternative embodiments, a different distribution of processing is implemented, for example, by having internal controller 608 perform pre-processing, such as calculating the syndrome (or some other precursor information utilized in locating errors) and communicating the syndrome to flash controller 424, and by having error repair circuit 426 of flash controller 424 calculate the error location(s) from the syndrome. In at least some embodiments, internal controller 610 controls the transmission (and the timing of transmission) to flash controller 424 of read data from I/O buffer 606 and the error location information (which may specify the actual error location(s) or information, such as the syndrome, used to calculate the error location(s)) determined by error detection circuit 610. For example, in the illustrated embodiment, internal controller 608 implements this control by providing the relevant select signals 618 to selection logic, such as multiplexer 620, which determines what data is chosen for transmission on communication bus 622.

Figure 7:
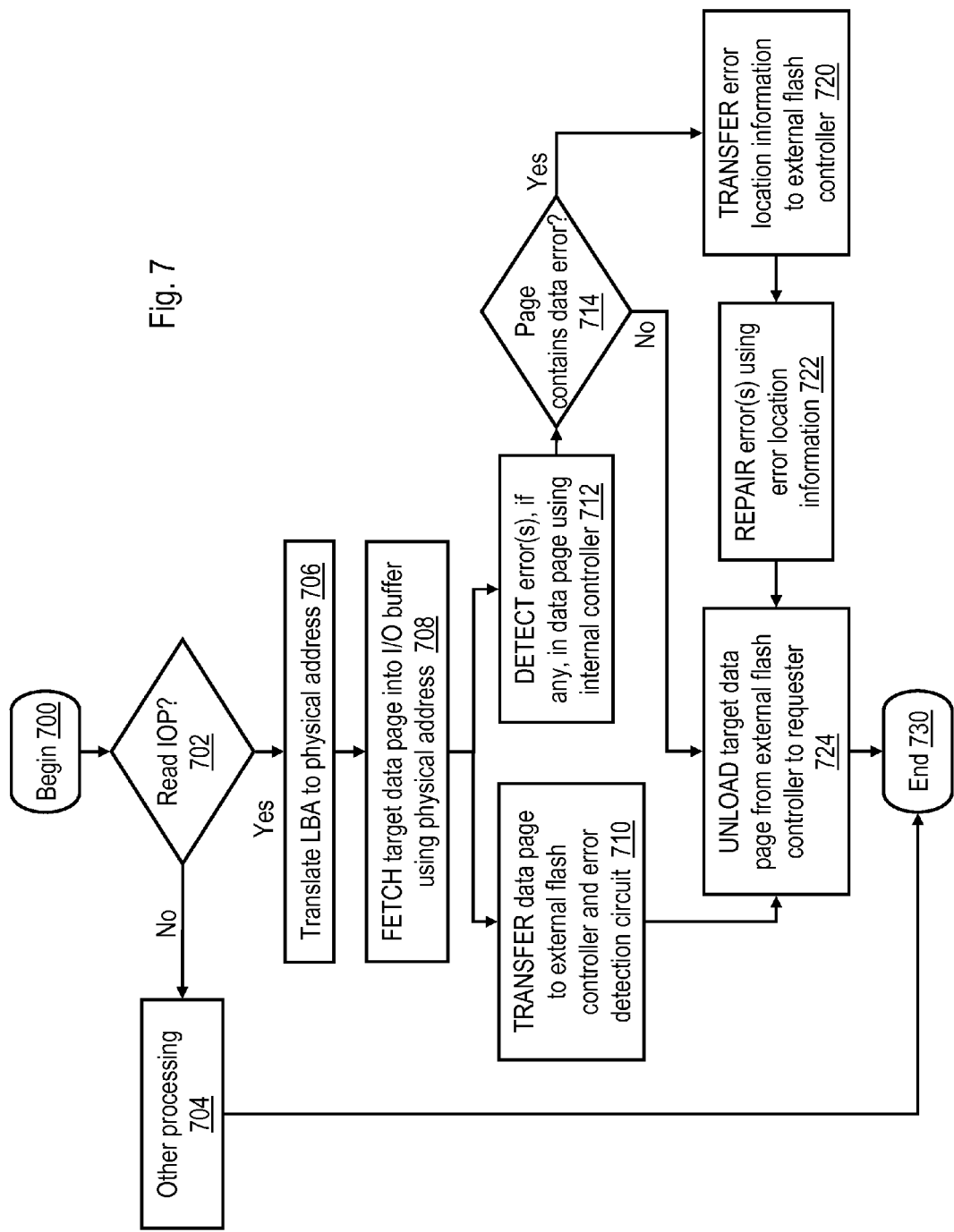
FIG. 7 is a high level logical flowchart of an exemplary method of performing a read operation in accordance with one embodiment.
Figure 8:
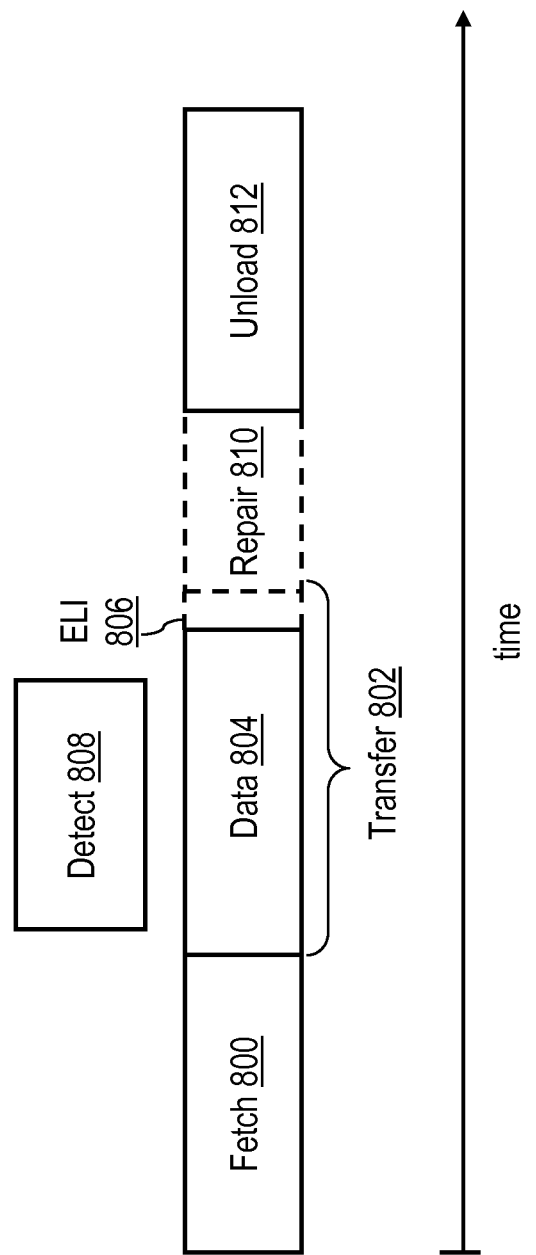
FIG. 8 is a timing diagram depicting a read operation in accordance with one embodiment.

Still referring to FIG. 6, and with additional reference to FIGS. 7-8, an exemplary process is described by which a data storage system having lossy storage media, such as NAND flash memory, performs a read operation. FIG. 6 illustrates the data flow of the exemplary process, FIG. 7 provides a high level logical flowchart of the exemplary process, and FIG. 8 provides a timing diagram of the exemplary process.

Referring specifically to FIG. 7, the flowchart begins at block 700 and then proceeds to block 702 in response to receipt by external flash controller 424 of an IOP from processor system 402. At block 702, flash controller 424 determines if the IOP is a read IOP requesting data to be read from NAND flash memory array 440. In response to a determination at block 702 that the IOP is not a read IOP (e.g., the IOP is a write IOP), flash controller 424 performs other, possibly conventional, processing at block 704. Thereafter, the process of FIG. 7 ends at block 730.

Returning to block 702, in response to a determination that the IOP that was received is a read IOP, the process proceeds to block 706, which illustrates flash controller 424 translating the logical block address (LBA) contained in the read IOP into a physical address, for example, by reference to translation table 434 in flash controller memory 432. Using the physical address, flash controller 424 issues a command on the appropriate memory channel to invoke a fetch suboperation in which the target data page is fetched from the flash array 604 of a particular flash die 602 into the associated I/O buffer 606 (i.e., the I/O buffer 606 of the same flash die 602), as shown at block 708. The fetch suboperation of the read operation is shown at reference numeral 800 of FIG. 8.

Following the fetch suboperation, the process proceeds to both blocks 710 and 712, which are preferably performed in parallel, that is, overlapping in time. At block 710, internal controller 608 initiates a transfer suboperation in which internal controller 608 causes I/O buffer 606 to transfer the target data page to external flash controller 424 (via multiplexer 620) and to error detection circuit 610 of internal controller 608. The transfer suboperation is depicted in FIG. 6 and is also depicted generally at reference numeral 802 of FIG. 8, and more particularly, at reference numeral 804, which denotes the transfer of the target data page. From block 710, the process of FIG. 7 proceeds to block 724, which is described below.

Contemporaneously with the transfer suboperation, internal controller 608 also causes an error detect suboperation to be performed by error detection circuit 610 in order to identify bit location(s) of error(s), if any, in the target data page, as shown at block 712. The error detection suboperation can be performed using parity, ECC, and/or any other existing or future developed error detection technique. The error detect suboperation, which is illustrated in FIG. 6 and at reference numeral 808 of FIG. 8, can generally be completed during the transfer of the data page to external flash controller 424 given the co-location of error detection circuit 610 and flash die 602 within the same physical package (i.e., flash memory module 600). As noted above, in alternative embodiments, the error detect suboperation performed by internal controller 608 may calculate error location information, such as a syndrome, that can be used by error repair circuit 426 to calculate the actual bit location(s) of the error(s), if any.

As indicated at block 714, if error detection circuit 610 does not detect a bit error in the target data page, the process passes from block 712 through block 714 to block 724, which is described below. If, however, error detection circuit 610 detects at least one bit error in the target data page, the process proceeds from block 712 through block 714 to block 720.

Block 720 illustrates internal controller 608 causing error detection circuit 610 to transfer error location information, for example, information specifying the locations of the bit error(s) detected in the target data page or a syndrome utilized to calculate such locations, to error repair circuit 426 of flash controller 424 via multiplexer 620 and communication bus 622. In at least some embodiments, internal controller 608 can conveniently append the error location information (ELI) at the end of the transfer suboperation 802 following transfer of the target data page, as shown in FIG. 8 at reference numeral 806. In alternative embodiments, internal controller 608 can interleave transmission of the error location information with transmission of the target data page in order to facilitate correction of earlier transmitted portions of the target data page during transfer of subsequent portions of the target data page. It should be noted that in any event, error location information 806, if present, constitutes a very small quantity of information, meaning that the total latency of transfer 802 is substantially the same as that of the transfer of the target data page as shown at reference numeral 804.

The process of FIG. 7 proceeds from block 720 to block 722, which illustrates error repair circuit 426 of external flash controller 424 repairing (correcting), if possible, the correctable errors in the target data page in a correct suboperation utilizing the error location information supplied by error detection circuit 610. The error repair suboperation can be performed using parity, ECC, or any other existing or future developed error repair technique. The repair suboperation is illustrated at reference numeral 810 of FIG. 8. The process of FIG. 7 then proceeds from block 722 to block 724.

Block 724 illustrates flash controller 424 performing an unload (forward) suboperation, for example, by transmitting the target data page, as corrected, to the requester in processor system 402 via I/O channel 410. The unload suboperation is shown in FIG. 6 and at reference numeral 812 of FIG. 8. Following the unload suboperation, the process of FIG. 7 ends at block 730.

Figure 1:
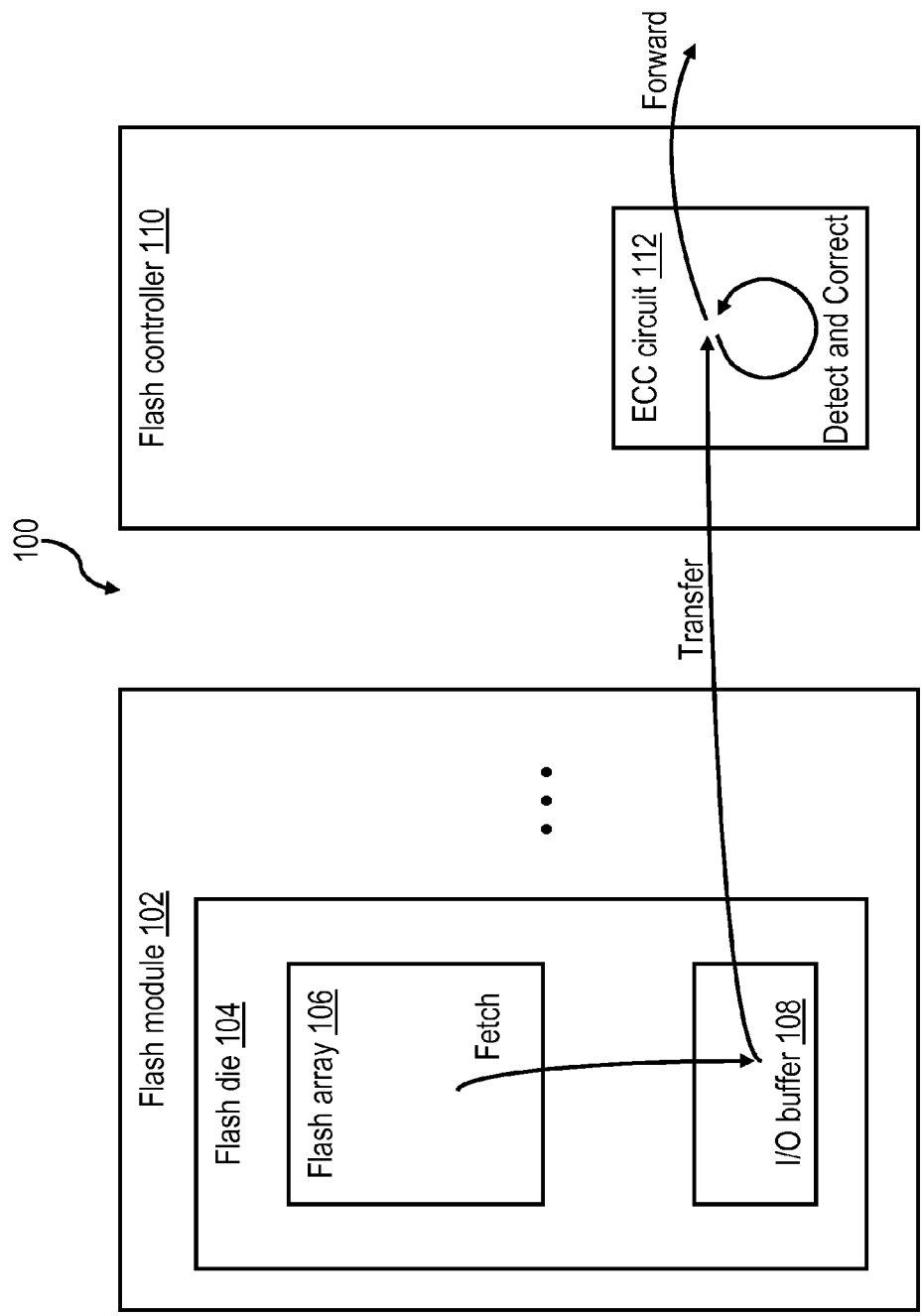
FIG. 1 is a block diagram of a first conventional flash memory system.
Figure 2:
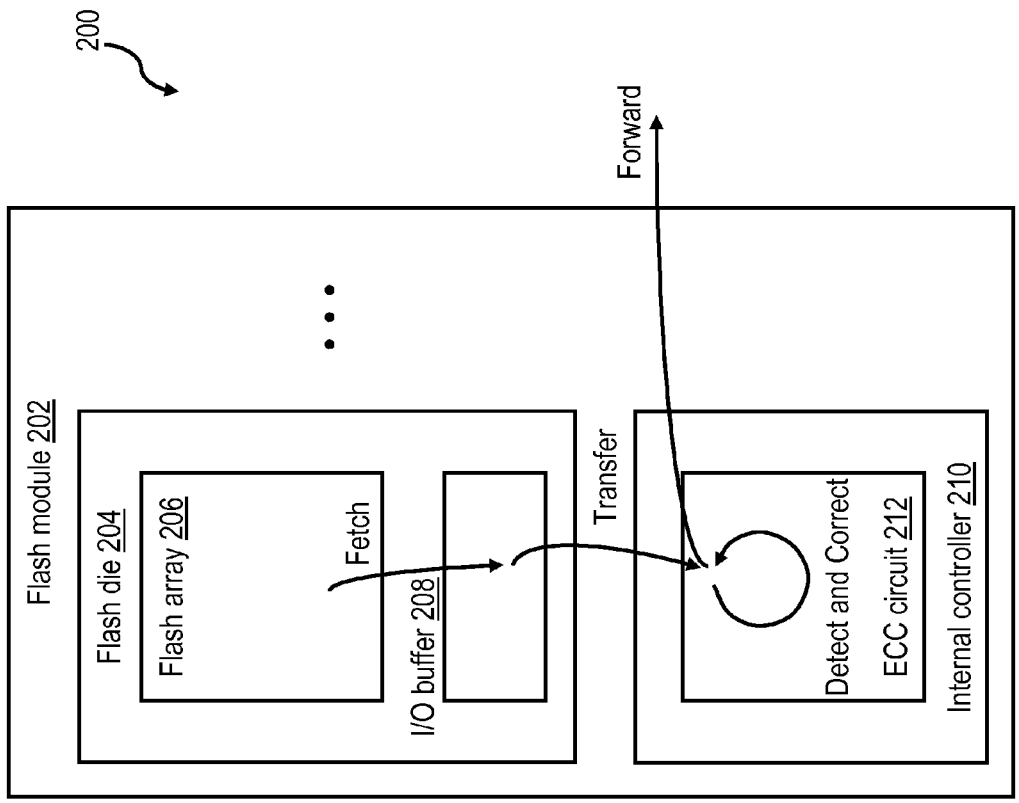
FIG. 2 is a block diagram of a second conventional flash memory system.
Figure 3:
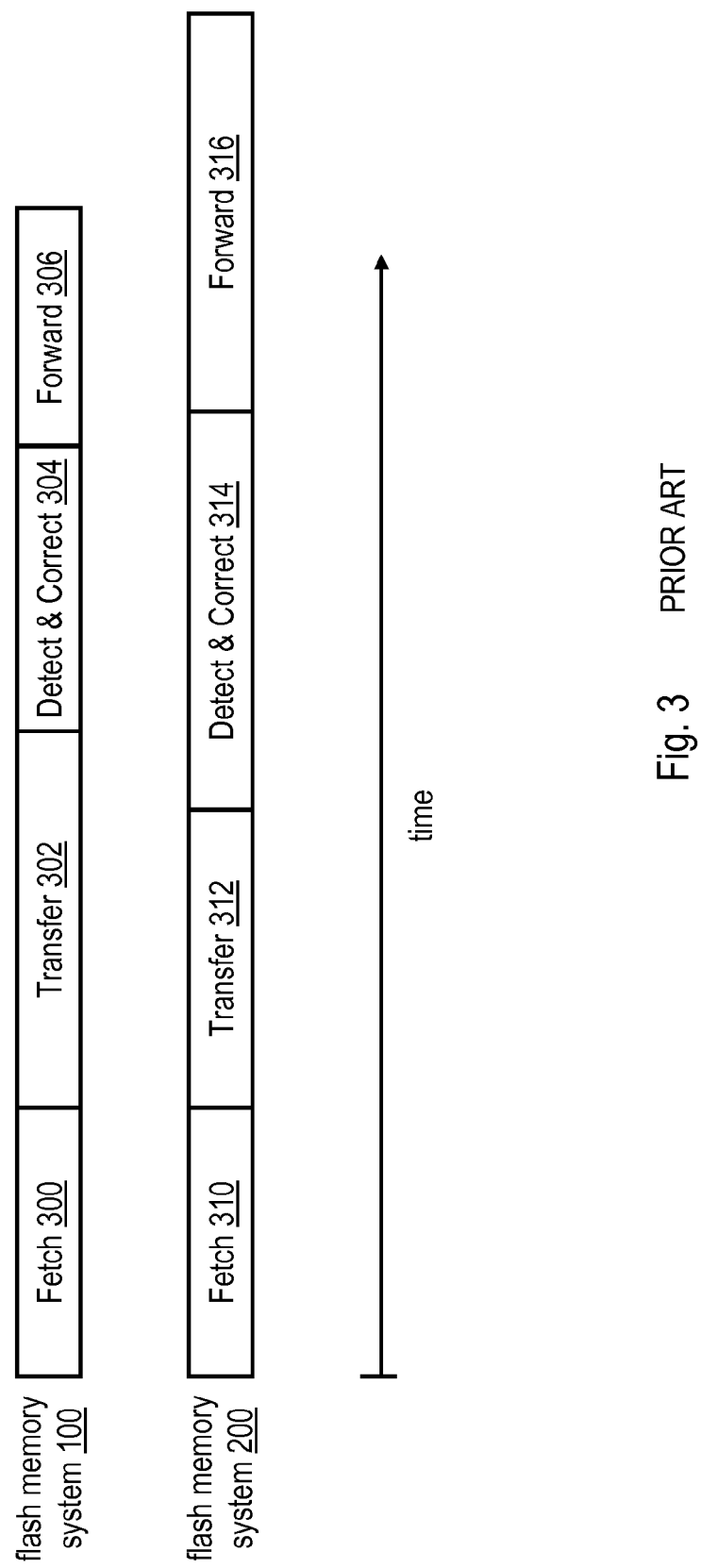
FIG. 3 is a timing diagram illustrating the relative read latencies of the first and second conventional flash memory systems depicted in FIGS. 1 and 2.

As can be seen by comparison of FIG. 8 with FIG. 3, the disclosed technique of performing a read operation deserializes the suboperations comprising the read operation by enabling at least the error detection and transfer suboperations to be performed simultaneously. Consequently, the overall latency of a read operation can be advantageously reduced.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As has been described, in at least one embodiment, a read operation in a data storage system having lossy storage media includes fetching target data of the read operation from a lossy storage device into a buffer, transferring the target data from the buffer to an external controller external to the lossy storage device via a communication bus, performing error location processing on the target data during the transferring of the target data, communicating error location information regarding at least one error location to error repair logic via the communication bus, the error repair logic repairing the at least one error in the target data using the error location information, and the external controller causing the target data as repaired to be transmitted toward a destination. By deserializing the suboperations comprising the read operation, read latency can be reduced.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transitory propagating media per se.

In addition, although embodiments have been described that include use of a NAND flash memory, it should be appreciated that the inventions herein are not limited to use with NAND flash memory, but are instead applicable to any other lossy storage media. For example, the disclosed techniques may be applied to phase-change memory (PCM), magnetoresistive RAM (MRAM) and resistive RAM (RRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of performing a read operation in a data storage system having lossy storage media, the method comprising:
   in response to a read request, performing a read operation, including:

fetching target data of the read operation from a lossy storage device into a buffer;
an internal controller of the lossy storage device transferring the target data from the buffer to an external controller external to the lossy storage device via a communication bus;
during the transferring of the target data, performing, utilizing error detection logic within the lossy storage device, error location processing on the target data;
the internal controller communicating error location information regarding at least one error location in the target data detected by the error detection logic to error repair logic within the external controller via the communication bus;
in response to receiving the error location information via the communication bus, the error repair logic within the external controller repairing at least one error in the target data using the error location information, wherein the repairing includes:
calculating at least one corrected bit value for at least one bit location determined from the error location information; and
substituting the at least one corrected bit value into the target data at the at least one bit location; and
the external controller causing the target data as repaired to be transmitted toward a destination.

2. The method of claim 1, wherein the buffer is disposed within the lossy storage device.

3. The method of claim 1, wherein performing error location processing includes determining the at least one error location in the target data.

4. The method of claim 1, wherein the communicating comprises communicating the error location information after the transferring.

5. The method of claim 1, wherein the communicating comprises communicating the error location information during the transferring.

6. The method of claim 1, wherein the lossy storage device comprises a flash memory module.

7. The method of claim 1, wherein performing the error location processing includes calculating a syndrome for the target data and calculating the at least one bit location based on the syndrome.

8. A data storage system, comprising:
a communication bus;
a lossy data storage device coupled to the communication bus, wherein the lossy data storage device includes lossy data storage, a buffer, and error detection logic, wherein the lossy data storage device, in a read operation, fetches target data of the read operation that includes at least one error from the lossy data storage into the buffer and transfers the target data including the at least one error from the buffer to the error detection logic and on the communication bus, and wherein the error detection logic, during the transferring of the target data on the communication bus, performs error location processing on the target data, and wherein the error detection logic communicates, on the communication bus, error location information regarding at least one error location in the target data detected by the error detection logic;
an external controller external to the lossy data storage device and coupled to the communication bus, wherein the external controller includes error repair logic that, responsive to receipt of the error location information and the target data via the communication bus, repairs the at least one error in the target data using the error location information by calculating at least one corrected bit value for at least one bit location determined from the error location information and substituting the at least one corrected bit value into the target data at the at least one bit location, and wherein the external controller thereafter causes the target data as repaired to be transmitted toward a destination.

9. The data storage system of claim 8, wherein the buffer is disposed within a same die as the lossy data storage device.

10. The data storage device of claim 8, wherein the error location information identifies the at least one error location.

11. The data storage system of claim 8, wherein the lossy data storage device includes an internal controller including the error detection logic.

12. The data storage system of claim 8, wherein the error detection circuit communicates the error location information after transferring the target data.

13. The data storage system of claim 8, wherein the error detection circuit communicates the error location information during transfer of the target data on the communication bus.

14. The data storage system of claim 8, wherein the lossy storage device comprises a flash memory module.

15. A data processing system comprising:
the data storage system of claim 8; and
a processor system coupled to the data storage system.

16. The data storage system of claim 8, wherein the error detection logic performs the error location processing by calculating a syndrome for the target data and calculating the at least one bit location based on the syndrome.

17. A program product, comprising:
a storage device; and
program code stored in the storage device, wherein the program code, when executed in a data storage system having a lossy storage device coupled to an external controller by a communication bus, causes the data storage system to perform:
in response to a read request, performing a read operation, including:
fetching target data of the read operation from the lossy storage device into a buffer;
an internal controller within the lossy storage device transferring the target data from the buffer to the external controller external to the lossy storage device via the communication bus;
during the transferring of the target data, performing error location processing on the target data within the lossy storage device;
the internal controller communicating error location information identifying at least one error location in the target data detected by the error detection logic to error repair logic within the external controller via the communication bus;
in response to receiving the error location information via the communication bus, the error repair logic within the external controller repairing at least one error in the target data using the error location information, wherein the repairing includes:
calculating at least one corrected bit value for at least one bit location determined from the error location information; and
substituting the at least one corrected bit value into the target data at the at least one bit location; and
the external controller causing the target data as repaired to be transmitted toward a destination.

18. The program product of claim 17, wherein fetching target data of the read operation from the lossy storage device into a buffer comprises fetching the target data of the read operation into a buffer disposed within the lossy storage device.

19. The program product of claim 17, wherein performing error location processing includes determining the at least one error location in the target data.

20. The program product of claim 17, wherein the communicating comprises communicating the error location information after the transferring.

21. The program product of claim 17, wherein the communicating comprises communicating the error location information during the transferring.

22. The program product of claim 17, wherein the lossy storage device comprises a flash memory module.

23. The program product of claim 17, wherein performing the error location processing includes calculating a syndrome for the target data and calculating the at least one bit location based on the syndrome.

* * * * *